(12) United States Patent
Seo et al.

(10) Patent No.: US 10,944,080 B2
(45) Date of Patent: Mar. 9, 2021

(54) DISPLAY APPARATUS

(71) Applicant: LG Display Co., Ltd., Seoul (KR)

(72) Inventors: Miyeon Seo, Paju-si (KR); Taehyoung Kwak, Goyang-si (KR); Sinchul Kang, Goyang-si (KR); Suk Choi, Hwaseong-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/592,680

(22) Filed: Oct. 3, 2019

(65) Prior Publication Data

US 2020/0161590 A1  May 21, 2020

(30) Foreign Application Priority Data

Nov. 15, 2018  (KR) .................. 10-2018-0140766

(51) Int. Cl.
 *H01L 51/52* (2006.01)

(52) U.S. Cl.
 CPC ...... *H01L 51/5284* (2013.01); *H01L 51/5246* (2013.01); *H01L 2251/5338* (2013.01)

(58) Field of Classification Search
 CPC ......... H01L 27/3272; H01L 2251/5338; H01L 51/5284
 See application file for complete search history.

(56) References Cited

U.S. PATENT DOCUMENTS

| 10,603,942 B2 | 3/2020 | Morozumi et al. |
| 2013/0100039 A1 | 4/2013 | Hong et al. |
| 2014/0054145 A1 | 2/2014 | Chi et al. |
| 2014/0204286 A1 | 7/2014 | Park et al. |
| 2016/0202782 A1 | 7/2016 | Park et al. |
| 2016/0357052 A1* | 12/2016 | Kim ................. H01L 51/5237 |
| 2017/0277314 A1* | 9/2017 | Chen ................ G06F 3/044 |
| 2017/0373281 A1 | 12/2017 | Park et al. |

(Continued)

FOREIGN PATENT DOCUMENTS

| CN | 107748461 A | 3/2018 |
| CN | 107807468 A | 3/2018 |
| JP | 2009-192792 A | 8/2009 |

(Continued)

OTHER PUBLICATIONS

European Patent Office, Extended European Search Report and Opinion, EP Patent Application No. 19207792.3, dated Apr. 6, 2020, 17 pages.

(Continued)

*Primary Examiner* — Changhyun Yi

(74) *Attorney, Agent, or Firm* — Fenwick & West LLP

(57) ABSTRACT

A display apparatus includes a flexible display panel including a display area configured to display an image and a periphery area adjacent to the display area, a first light shielding member, configured to shield a light at least a portion of the periphery area at a first light shielding rate, disposed on the flexible display panel, an adhesive member configured to cover the first light shielding member and the flexible display panel, a second light shielding member, overlapped at least a portion of the first light shielding member, configured to shield a light at a second light shielding rate, disposed on the adhesive member, and a cover member configured to cover the adhesive member and the second light shielding member.

19 Claims, 11 Drawing Sheets

(56) References Cited

U.S. PATENT DOCUMENTS

2018/0222236 A1    8/2018  Morozumi et al.
2019/0146290 A1*   5/2019  Park .................. G02F 1/133617
                                                    349/44

FOREIGN PATENT DOCUMENTS

JP    2015-060174 A      3/2015
KR    10-2017-0071372 A  6/2017
WO    WO 2017/073216 A1  5/2017

OTHER PUBLICATIONS

Japan Patent Office, Office Action, JP Patent Application No. 2019-202176, dated Dec. 8, 2020, 34 pages.

* cited by examiner

DISPLAY APPARATUS

REFERENCES TO CROSS-RELATED APPLICATIONS

This application claims the priority of Republic of Korea Patent Application No. 10-2018-0140766 filed on Nov. 15, 2018, in the Korean Intellectual Property Office, the disclosure of which is incorporated by reference in its entirety.

TECHNICAL FIELD

The present disclosure relates to a display apparatus, and more particularly to a foldable display apparatus with improved reliability.

BACKGROUND

The display apparatus receives an image signal and displays an image on the display area. A flexible display apparatus refers to a display apparatus having flexible characteristics. A flexible display apparatus includes a curved display apparatus that is bent to a specific shape, a rollable display apparatus that can be rolled to a specific radius of curvature, a foldable display apparatus that is foldable to a specific axis, and the like.

The display apparatus can be implemented with an electroluminescence element such as a micro light emitting diode (Micro LED), an organic light emitting diode (OLED), a quantum-dot light emitting diode (QLED), and the like.

A conventional display apparatus may include a display panel and a cover member that protects the display panel. A flat display panel including a glass substrate or a flexible display panel including a plastic substrate was applied to the display panel.

A conventional cover member uses curved tempered glass having a thickness of about 200 μm. The curved tempered glass has a gentle curvature in the bezel area, so that the bezel of the display is bent into a specific shape.

A conventional adhesive member with a thickness of about 100 μm fixes a conventional cover member and a conventional flexible display apparatus. Such a curved display apparatus has a relatively lower technical difficulty in terms of flexible technology as compared with the recently developed foldable type display apparatus. In addition, since the thickness of the conventional curved display apparatus was made thicker than the foldable type display apparatus of the present disclosure, problems that can be caused by the thickness and the level difference of each element did not occur.

SUMMARY

The inventors of the present disclosure have studied a folding characteristic of a foldable display apparatus among flexible display apparatuses.

The inventors of the present disclosure have recognized that it is relatively more difficult to achieve reliability of a foldable display apparatus than a general flexible display apparatus because the foldable display apparatus is folded.

The inventors of the present disclosure have studied about a foldable display panel and a foldable cover member, which are key elements of a foldable display apparatus, in order to improve folding characteristics of the foldable display apparatus.

Specifically, the inventors of the present disclosure have attempted to attach a foldable cover member on a foldable display panel in order to protect the display area of the foldable display panel. The inventors of the present disclosure have recognized that a thin cover member, which can maintain the folding property of the foldable display panel when the foldable cover member is attached, is required.

The inventors of the present disclosure have recognized that various problems may arise when applying a foldable cover member on a foldable display panel.

First, it has been recognized that the thickness of the foldable cover member needs be minimized to improve folding characteristics.

When the thickness of the foldable cover member is as thick as about 200 μm, it is recognized that cracks may occur in the foldable cover member and the foldable display panel when the foldable cover member is folded.

Specifically, when the thickness of the foldable cover member is thick, the neutral plane of the foldable display panel attached to the foldable cover member may be changed, and a tensile stress or a compressive stress applied to the foldable display panel can be increased. Accordingly, it was recognized that a stress-induced crack could be occurred in the foldable display panel.

Second, it has been recognized that the folding property can be improved by minimizing the thickness of the adhesive member for attaching the foldable cover member and the foldable display panel.

The thick adhesive member has an advantage that the level difference of the foldable display panel can be compensated to improve the flatness of the cover member. However, it has been recognized that the adhesive member can be peeled from the foldable cover member or the foldable display panel due to the bending stress applied to the thick adhesive member at the time of folding.

Specifically, when the thickness of the adhesive member is as thick as about 100 μm, the neutral plane of the foldable display panel attached to the foldable cover member is shifted, and the tensile stress or the compressive stress applied to the foldable display panel can be increased. Therefore, cracks may be generated in the foldable display panel due to stress, and it has been recognized that peeling may occur at the adhesive member due to tensile stress or compressive stress applied to the thick adhesive member. It was also recognized that oxygen and moisture could permeate into the foldable display panel through the peeled gaps.

Third, it has been recognized that when the thickness of the foldable cover member and the adhesive member is minimized, the flatness of the foldable display apparatus can be reduced.

The foldable display panel may have a structure in which a thin film transistor array, an electroluminescence diode, and an encapsulation unit are stacked and they have various steps in their surfaces due to the thickness and the patterns of the stacked elements.

Specifically, it is recognized that steps can be recognized by users such that when the foldable cover member and the adhesive member having the minimum thickness for the folding characteristic are attached to the foldable display panel, a step can be generated in the foldable cover member according to the step of the foldable display panel. Accordingly, it has been recognized that the flatness of the foldable display apparatus of the present disclosure can be lowered and the quality of appearance thereof can be lowered.

Fourth, when the thickness of the foldable cover member and the adhesive member is minimized, it is recognized that a step is generated due to the thickness of the light shielding member that shields the bezel area of the foldable cover member.

Specifically, the light shielding member requires a minimum thickness because it should shield the bezel area adjacent to the display area of the foldable display panel from being visible to the user. If the thickness of the light shielding member is too thin, semi-transparent characteristics may occur or the light shielding rate may be lowered. Therefore, when a conventional light shielding member is applied to a thin foldable cover member and a thin adhesive member, it is recognized that a level difference occurs in the bezel region, thereby lowering the flatness of the foldable display apparatus and degrading the appearance thereof.

Specifically, when the thickness of the light shielding member is about 12 μm to 20 μm, steps caused by the light shielding member can be generated. At this time, since the thickness of the adhesive member is not sufficiently thick, bubbles may be generated in the stepped portion, and it is recognized that the step and the stress applied when folding can cause the adhesive member to peel off.

Therefore, the inventors of the present disclosure recognized that the thickness of the foldable cover member and the adhesive member should be minimized, and recognized that the reliability and flatness problems that can be generated need to be improved.

Accordingly, the present disclosure discloses solutions of the above-mentioned problems occurred in the conventional art.

The problems of the present disclosure are not limited to the above-mentioned problems, and other problems not mentioned can be clearly understood by those skilled in the art from the following description.

According to the embodiments of the present disclosure, a display apparatus may include a flexible display panel including a display area configured to display an image and a periphery area adjacent to the display area, a first light shielding member, configured to shield a light at least a portion of the periphery area at a first light shielding rate, disposed on the flexible display panel, an adhesive member configured to cover the first light shielding member and the flexible display panel, a second light shielding member, overlapped at least a portion of the first light shielding member, configured to shield the light at a second light shielding rate, disposed on the adhesive member, and a cover member configured to cover the adhesive member and the second light shielding member.

A thickness of the first light shielding member and a thickness of the second light shielding member may be the same, and a light shielding rate of the area, where the first light shielding member and the second light shielding member are overlapped, may be 90% or more.

A thickness of the first light shielding member and a thickness of the second light shielding member may be different from each other, and a light shielding rate of the area where the first light shielding member and the second light shielding member are overlapped is 90% or more.

An optical density level of each of the first light shielding member and the second light shielding member may be less than 5, and an overall optical density level according to an overlap of the first light shielding member and the second light shielding member may be 5 or more.

A sum of thicknesses of the first light shielding member and the second light shielding member may be less than 14 μm.

A thickness of each of the first light shielding member and the second light shielding member may be 1 μm to 7 μm.

The adhesive member may be configured to compensate a step between the first light shielding member and the second light shielding member, and the step of the cover member may be reduced by the adhesive member.

According to the embodiments of the present disclosure, a foldable display apparatus may include a flexible display panel, a plurality of light shielding members, configured to shield a light at least a portion of a periphery area surrounding a display area of the flexible display panel, overlapped each other, an adhesive member disposed between the plurality of light shielding members, and a cover member disposed on the plurality of light shielding members and the adhesive member.

The adhesive member may be disposed between the plurality of shielding members so as to compensate a step of the plurality of shielding members.

The flexible display panel may include a plurality of non-folding areas and a folding area between the plurality of non-folding areas, and the plurality of light shielding members may be positioned at least in the folding area.

At least one of the plurality of light shielding members may be configured to cover the periphery area of the plurality of non-folding area.

The at least one light shielding member covering the periphery area may be connected to one of the plurality of light shielding members in the folding area, and a thickness of the connected shielding member may be relatively thinner in the folding area than in the non-folding area.

A cross section of at least one of the plurality of light shielding members may be configured to have a taper whose thickness is gradually increased.

The plurality of light shielding members may overlap each other and may include a predetermined area whose thickness is gradually increased in the same direction.

According to the embodiments of the present disclosure, a display apparatus may include a flexible display panel, and a plurality of light shielding members, configured to shield a light at least a portion of a periphery area surrounding a display area of the flexible display panel, in which at least a portion thereof are overlapped with each other, wherein at least one of the plurality of light shielding members is configured to have a translucent characteristic determined by a first thickness range, and wherein the plurality of light shielding members is configured to have an opaque characteristic such that a sum of thicknesses of at least two light shielding members vertically overlapped each other is equal to or greater than a second thickness.

The second thickness may be thicker than the first thickness range.

The plurality of light shielding members may include at least three light shielding members.

A first light shielding member among the plurality of light shielding members may be configured to have a first width in the periphery area, a second light shielding member among the plurality of light shielding members may be configured to have a second width different from the first width in the periphery area and may be configured to overlap with the first light shielding member, and a third light shielding member among the plurality of light shielding members, may be configured to have a third width different from the second width in the periphery area, may not be overlapped with the first light shielding member, and may be overlapped with the second light shielding member.

The flexible display panel may include a non-folding area and a folding area, and at least one of the plurality of light shielding members in the non-folding area may be smaller in number than the plurality of light shielding members in the folding area.

The display apparatus may further comprise an adhesive member disposed between the plurality of light shielding members and a cover member covering the adhesive member and the plurality of light shielding members. The cover member may comprise at least one material among acrylic, polyurethane, polyacrylate, polyacetate, polyester, polyether, olefin, polyimide, silicone, and epoxy. The cover member may be coated of a thickness of 5 μm to 20 μm.

Embodiments also relate to a display apparatus including a flexible display panel including a display area configured to display an image and a periphery area adjacent to the display area. The display apparatus includes a first light shielding member disposed on at least the periphery area of the flexible display panel, an adhesive member covering the first light shielding member and the flexible display panel, and a second light shielding member disposed on the adhesive member and the first light shielding member in a first direction. At least a portion of the second light shielding member may overlap at least a portion of the first light shielding member in the first direction. The display apparatus may also include a cover member covering the adhesive member and the second light shielding member.

Embodiments also relate to a foldable display apparatus including a flexible display panel, a plurality of light shielding members on the flexible display panel. At least two of the plurality of light shielding members may overlap with each other in a first direction. The foldable display apparatus may also include an adhesive member disposed between the plurality of light shielding members, and a cover member disposed on the plurality of light shielding members and the adhesive member.

Embodiments also relate to a display apparatus including a flexible display panel, and a plurality of light shielding members arranged along a first direction on the flexible display panel. Two or more of the plurality of light shielding members may overlap with each other in the first direction. At least one of the plurality of light shielding members may be translucent, and an overlapped portion of the two or more light shielding members may be opaque.

The details of the embodiments of the present disclosure are included in the detailed description and drawings.

The display apparatus according to the embodiments of one aspect of the present disclosure has the effect of reducing the peeling off of the cover member of the display apparatus by overlapping the thin light shielding members overlapping each other.

The display device according to the embodiments of one aspect of the present disclosure has the effect of reducing the step difference of the edge portion even when the thin cover member is applied by overlapping each other of the thin type light shielding members.

The display device according to the embodiments of one aspect of the present disclosure has the effect of reducing the light leakage problem, due to the translucent characteristics that can be occurred by thinning the light shielding member, by overlapping each other of the thin light shielding members.

The effects according to the present disclosure are not limited by the contents exemplified above, and more various effects are included in the present disclosure.

DETAILED DESCRIPTION OF THE EMBODIMENTS

Figure 1:
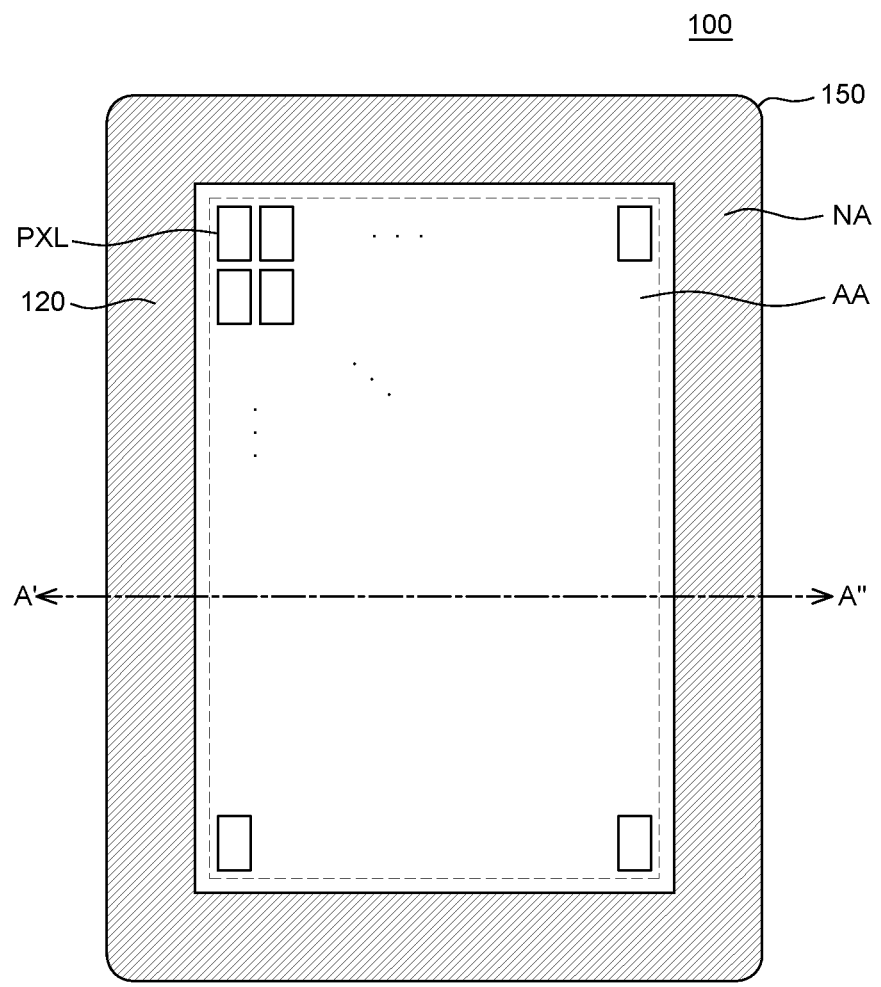
FIG. 1 is a plan view schematically illustrating a display apparatus according to an embodiment of the present disclosure.

Advantages and characteristics of the present disclosure and a method of achieving the advantages and characteristics will be clear by referring to the embodiments described below in detail together with the accompanying drawings. However, the present disclosure is not limited to the embodiment disclosed herein but will be implemented in various forms. The embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range (e.g., a tolerance range) even if not expressly stated.

When the position relation between two elements is described using the terms such as "on", "above", "below", and "next", one or more elements may be positioned between the two parts unless the terms are used with the term "immediately" or "directly".

When an element or a layer is "on" another element or another layer, it may be interpreted as such the other layer or the other element can be interposed on or in the middle of another element.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals refer to like elements throughout the specification.

Area and thickness of each element shown in the figures are merely for illustrative purpose for convenience of description, but are not necessarily limited to the area and thickness of the configuration of the present disclosure as illustrated.

Each of the features of the various embodiments of the present disclosure can be combined with each other partly or entirely. The features of the various embodiments can be technically interlocked and driven as well. The features of the various embodiments can be practiced independently or in conjunction with each other independently of each other.

Hereinafter, various embodiments of the present disclosure will be described in detail with reference to accompanying drawings.

Figure 2:
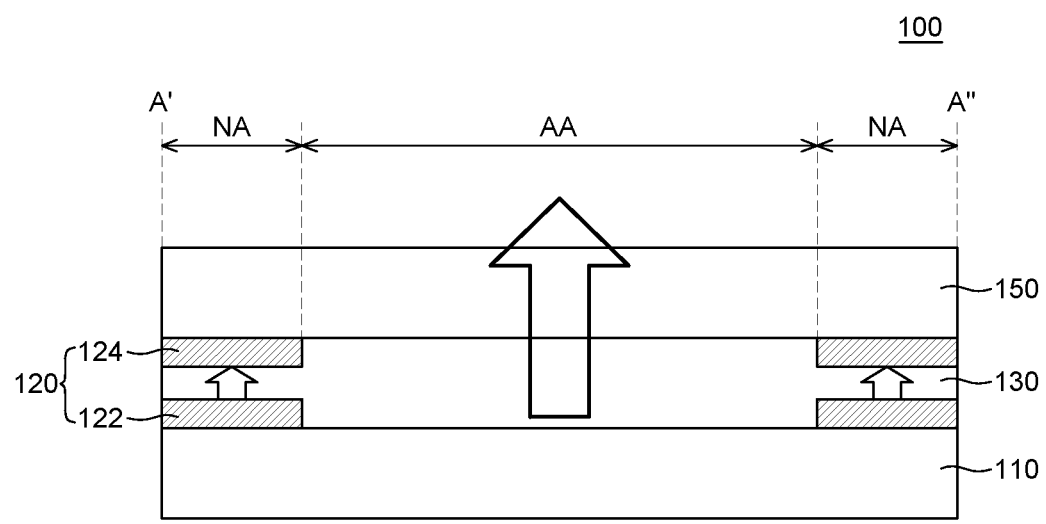
FIG. 2 is a cross-sectional view schematically illustrating a cross-section A'-A" of the display apparatus of FIG. 1 according to an embodiment of the present disclosure.

FIG. 1 is a plan view schematically illustrating a display apparatus according to an embodiment of the present disclosure. FIG. 2 is a cross-sectional view schematically illustrating a cross-section A'-A" of the display apparatus of FIG. 1 according to an embodiment of the present disclosure.

Hereinafter, a display apparatus 100 according to an embodiment of the present disclosure will be described with reference to FIGS. 1 and 2. The display apparatus 100 according to an embodiment of the present disclosure may include a display panel 110, a light shielding structure 120, an adhesive member 130, and a cover member 150.

The display panel 110 of the display apparatus 100 according to an embodiment of the present disclosure may be implemented as a flat panel display panel, a curved display panel, a flexible display panel, or a foldable display panel.

The display panel 110 is configured to include a plurality of pixels PXL capable of displaying an image. The display panel 110 may have a rectangular shape, but the present disclosure is not limited to the shape. For example, the display panel 110 may have a rounded shape. For example, a part of the display panel 110 may be a curved shape, or one side edge may be curved. For example, the display panel 110 may be circular, elliptical, curved, or polygonal. However, the present disclosure is not limited thereto.

An area where a plurality of pixels PXL is arranged can be defined as a display area AA. The periphery of the display area AA can be defined as the periphery area NA.

For example, a driving circuit, such as a signal wiring, a gate driver IC, and a data driver IC for transmitting signals to a plurality of pixels PXL of the display area AA, may be disposed in the periphery area NA. Thus, the plurality of pixels PXL can be driven. However, the present disclosure is not limited thereto. In other words, the periphery area NA may be defined as an area surrounding the display area AA, but the present disclosure is not limited thereto. The periphery area NA may be defined as at least a partial area adjacent to the display area AA.

The pixel PXL may include a plurality of sub-pixels. The sub-pixel can be a minimum unit constituting the display area AA, and each sub-pixel can be configured to display light of a specific wavelengths. For example, each sub-pixel may be configured to display red, green, blue, or white light. For example, each of the plurality of sub-pixels may be provided with an electroluminescence element including an anode, an electroluminescence layer, and a cathode, but the present disclosure is not limited thereto.

The driving circuit may be provided for driving a plurality of sub-pixels. The driving circuit may include semiconductor elements, wirings, and the like. For example, the driving circuit may include a thin film transistor, a storage capacitor, a gate wiring, a data wiring, and the like. However, the present disclosure is not limited thereto.

The display panel 110 may have rigidity or flexibility depending on the characteristics of the substrate.

For example, when the substrate of the display panel 110 is glass having a predetermined thickness or more, the display panel 110 may have rigidity characteristics and may be referred to as a flat panel display panel.

For example, when the substrate of the display panel 110 is a plastic substrate, the display panel 110 may have characteristics of a flexible display panel. If the display panel 110 is a flexible display panel, it may be divided into a curved display panel, a rollable display panel, and a foldable display panel depending on the ductility characteristics of the display panel 110. However, the present disclosure is not limited thereto. For example, the flexible display panel can be bent in the horizontal, vertical, and/or diagonal directions.

The light shielding structure 120 is disposed on the display panel 110 of the display apparatus 100 according to an embodiment of the present disclosure.

The light shielding structure 120 is an element that is disposed at least in the periphery area NA of the display panel 110 to block some elements such as a driving circuit disposed in periphery of the display panel 110 from being seen from the outside. For example, the light shielding structure 120 may be disposed on all or most of the periphery area NA of the display panel 110. However, the present disclosure is not limited thereto. For example, the light shielding structure 120 may be referred to as a black matrix or a decoration film in a functional point of view.

The light shielding structure 120 is configured to include at least a first light shielding member 122 and a second light shielding member 124. The plurality of light shielding members 122, 124 of the light shielding structure 120 are spaced apart from each other and overlap each other.

The first light shielding member 122 may be disposed in at least a part of the periphery area NA. The second light shielding member 124 may be configured to overlap with the first light shielding member 122 while being disposed in at least a part of the periphery area NA. The second light shielding member 124 may be disposed on the first light shielding member 122 in a first direction, and at least a portion of the second light shielding member 124 may overlap at least a portion of the first light shielding member 122 in the first direction. The first light shielding member 122 may be disposed directly on the display panel 110, whereas the second light shielding member 124 might be disposed directly under the cover member 150. Thus, the adhesive member 130 might be disposed between the first light shielding member 122 and second light shielding member 124.

The light shielding structure 120 may be made of a material such as black ink e.g., a polymer filled with carbon black. But the present disclosure is not limited thereto, and it may be made of a material capable of absorbing light. The light shielding structure 120 preferably provides a sufficient level of light shielding function so that the surrounding area cannot be seen by a user.

At least one of the light shielding members 122, 124 of the light shielding structure 120 may be formed by, for example, ink-jet printing or screen printing of a carbon black composition, followed by curing using ultraviolet light.

The light shielding members 122, 124 might be made base on different materials and/or might be differently formed.

The total thickness of the light shielding structure 120 may be uniform. However, the present disclosure is not limited thereto, and the total thickness of the light shielding structure 120 may be reduced toward the display area AA. When the thickness of at least one light shielding member decreases continuously or progressively toward the display area AA, it can reduce the step between the display area AA and the periphery area NA. Thus, there are effects that the step generated due to the light shielding structure 120 can be alleviated and the appearance quality of the display apparatus 100 can be improved.

Furthermore, the thickness of the first and second shielding members 122, 124 might be same or different.

Hereinafter, the thickness of the light shielding structure 120 will be described in more detail. The conventional black matrix has been applied to various flat panel display devices, and there were no such technical problems depending on the thickness. For example, a conventional black matrix has been implemented as a single layer with a thickness of about 20 μm. A single layer black matrix having such a thickness could provide sufficient light-shielding characteristics. However, when the thickness of the black matrix is, for example, 12 μm or less, the light shielding ability may be lowered and the light can be recognized as a light leakage to a user. Thus, it has been a common idea to think that it is not desirable to reduce the thickness of the black matrix so as to realize translucent characteristics.

The light transmittance can be expressed, for example, the optical density level below 5 can be defined as a level that light leakage can be recognized. The optical density level 5 or higher can be defined as a level that light leakage cannot be recognized. In one instance, the optical density level may be measured as $OD=\log(I_0/I)$ where OD is the Optical Density, $I_0$ is the incident optical intensity, and I is the transmitted optical intensity).

For example, the thickness of each light shielding member can be adjusted so that the optical density level of each of the first light shielding member 122 and the second light shielding member 124 is less than 5, and the total optical density level due to the overlap of the first light shielding member 122 and the second light shielding member 124 is 5 or more. For example, a portion of the first light shielding member 122, a portion of the second light shielding member 124, and a portion of the adhesive member 130 between the first light shielding member 122 and the second light shielding member 124 that overlap each other in the first direction may have an optical density level of 5 or more. For example, the sum of the thicknesses of the first light shielding member 122 and the second light shielding member 124 may be less than 14 μm. The thickness of each of the first light shielding member 122 and the second light shielding member 124 may be 1 μm to 7 μm.

At least one light shielding member of the plurality of light shielding members 122, 124 of the display apparatus 100 according to an embodiment of the present disclosure may be configured to have a predetermined thickness or less so as to have a translucent characteristic, i.e., semi-transparent characteristic.

For example, at least one or all of the first light shielding member 122 and the second light shielding member 124 may be configured to have translucent characteristics when considering the first or second light shielding member alone. Accordingly, the light shielding structure 120 may be configured to have an opaque characteristic as the plurality of light shielding members 122 and 124 overlap with each other.

For example, the thicknesses of the first light shielding member 122 and the second light shielding member 124 are different from each other, and the light shielding ratio of the region where the first light shielding member 122 and the second light shielding member 124 overlap can be configured to be 90% or more. Specifically, a portion of the first light shielding member 122, a portion of the second light shielding member 124, and a portion of the adhesive member 130 between the first light shielding member 122 and the second light shielding member 124 that overlap each other in a first direction may have a light shielding rate of 90% or more. In the present disclosure, the light shielding ratio may be defined as the ratio of the light that is absorbed by the light shielding member to the total amount of the incident light.

For example, the thicknesses of the first light shielding member 122 and the second light shielding member 124 are equal to each other, and the light shielding ratio of the region where the first light shielding member 122 and the second light shielding member 124 overlap can be configured to be 90% or more.

A typical adhesive member 130 may have a characteristic that the shape before curing can be partially deformed by pressure, viscosity, heat, or the like. The step difference compensating ability of the adhesive member is improved as the thickness of the adhesive member increases. However, as the thickness of the adhesive member is increased, the weight of the display apparatus can be increased, and the disadvantage that the thickness of the display device is increased can be generated. For example, a conventional adhesive member having a thickness of 100 μm or more has been applied to compensate the step of a conventional single layer black matrix.

The adhesive member 130 may be disposed between the first light shielding member 122 and the second light shielding member 124 of the display apparatus 100 according to an embodiment of the present disclosure. The adhesive member 130 may be disposed on the first light shielding member 122 and the second light shielding member 124 may be disposed on the adhesive member 130. The adhesive member 130 can be in contact with the first light shielding member 122 and the second light shielding member 124. So the adhesive member 130 may be disposed between the first light shielding member 122 and the second light shielding member 124. The adhesive member 130 may be made of a transparent polymer resin that can be cured by pressure, light, or heat. For example, the adhesive member 130 may be an optically clear adhesive (OCA) or an optically clear resin (OCR), but the present disclosure is not limited thereto.

The adhesive member 130 of the display apparatus 100 according to an embodiment of the present disclosure may have a characteristic that the shape before curing can be partially deformed. For example, the thickness of the adhesive member 130 may be 50 μm or less, and preferably, the thickness of the adhesive member 130 may be 30 μm or less. However, the present disclosure is not limited thereto. The above-described adhesive member 130 having said specific thickness range may be referred to as, for example, a thin adhesive member.

When the first shielding member 122 is disposed on the bottom surface of the adhesive member 130 and the second shielding member 124 is disposed on the upper surface of the adhesive member 130, the adhesive member 130 may be deformed by pressure, viscosity, heat, or the like.

In other words, the bottom surface and the upper surface of the adhesive member 130 may be in contact with the light shielding members 122, 124 and can be deformed by a plurality of the light shielding members 122, 124. According to the above-described configuration, there is an effect that the step according to the thickness of the plurality of light shielding members 122, 124 can be relatively better compensated than the conventional single layer black matrix. That is, there is an effect that compensation of the step can be better when a plurality of thinner layers is disposed on the upper and bottom sides than a thick single layer is disposed. The contact area of the adhesive member 130 and the light shielding members 122, 124 may be the peripheral area NA.

In addition, when the thickness of the black matrix of the conventional single layer and the total thickness of the light shielding members 122, 124 of the light shielding structure 120 according to an embodiment of the present disclosure are the same, it has been observed that the step-difference compensation ability according to the combination of the adhesive member 130 and the light shielding structure 120 of the display apparatus 100 according to an embodiment of the present disclosure is superior to that of the conventional single layer black matrix.

In addition, when the thickness of the conventional single layer black matrix is 14 µm, according to the present disclosure the thickness of the first light shielding member 122 is 8 µm, and the thickness of the second light shielding member 124 is 8 µm, the step difference compensation ability of the first and second light shielding members 122, 124 can be superior to that of the conventional single layer black matrix even though the total thickness of the members 122 and 124 is slightly thicker than the conventional single layer black matrix.

When the light shielding structure 120 and the adhesive member 130 according to an embodiment of the present disclosure are provided, there is an effect that the step difference problem can be relatively reduced even if the thickness of the adhesive member 130 is reduced. Therefore, the thickness of the adhesive member 130 can be reduced. Therefore, the adhesive member 130 is configured to compensate the step of the first light shielding member 122 and the second light shielding member 124, and the effect that the step of the cover member 150 can be reduced by the adhesive member 130 can be achieved.

The cover member 150 may be arranged on the light shielding structure 120 and the adhesive member 130 of the display apparatus 100 according to an embodiment of the present disclosure.

The cover member 150 protects the display panel 110 from external impacts, reduces damage such as scratches, and transmits light emitted from the display panel 110 so the displayed image can be seen from the outside.

The cover member 150 may have a rectangular plate shape, but the present disclosure is not limited to the shape. For example, the cover member 150 may have a curved shape. For example, a part of the cover member 150 may have a curved shape, or one side edge may have a curved shape. For example, the cover member 150 may be circular, elliptical, curved, or polygonal. For example, the cover member 150 may have a shape corresponding to the shape of the display panel 110. Further, the shape of the display panel 110 may have a shape corresponding to said shape of the cover member 150 as described above.

The greater the thickness of the cover member 150, the better the characteristics of maintaining the shape of the cover member 150. That is, as the thickness of the cover member 150 becomes thicker, it is difficult to deform along the step of the contact surface contacting the cover member 150. Accordingly, the greater the thickness of the cover member 150, the more stress is applied at the contact surface having a stepped portion.

The cover member 150 may be a layer made of glass, tempered glass, plastic, or hard-coated resin. For example, when the cover member 150 is made of glass, since the cover member 150 has rigidity, the cover member 150 can more easily protect the display panel 110 from an external impact or the like. The cover member 150 may have, for example, a relatively thick thickness of 200 µm in order to ensure sufficient impact resistance. However, the present disclosure is not limited thereto.

Since the light shielding structure 120 according to an embodiment of the present disclosure has a multilayer structure, even when the thickness of the adhesive member 130 is reduced, there is an effect that the light shielding structure 120 can compensate for the level difference and reduce the peeling of the cover member 150.

If a conventional single layer black matrix is provided on an adhesive member having thin thickness, and a cover member is disposed thereon, the cover member and the adhesive member can be peeled off by the step generated by the black matrix of the conventional single layer. The peeled gap may be a permeation path of oxygen and/or moisture, and may cause damage to the display device.

That is, the display apparatus 100 according to an embodiment of the present disclosure may include a display panel 110 including a display area AA configured to display an image and a periphery area NA of the display area AA, a first light shielding member 122 arranged to cover a part of the periphery area NA with a first transmittance, an adhesive member 130 configured to cover the first light shielding member 122 and the display panel 110, a second light shielding member 124 disposed on the adhesive member 130 and configured to at least partially overlap with the first light shielding member 122 and configured to shield light at a second transmittance, a cover member 150 configured to cover the adhesive member 130, in particular in the display area AA and the second light shielding member 124, in particular in the peripheral area NA. According to said configuration, even if the thickness of the adhesive member 130 is reduced, as the light shielding structure 120 includes a plurality of light shielding members 122, 124, and at least one light shielding member is configured to have a thin thickness so as to have translucency, so that there is an effect that the step difference problem can be solved even if the thickness of the adhesive member 130 is reduced.

Also, the adhesive member 130 and the cover member 150 according to an embodiment of the present disclosure can be applied to a flat panel display, a flexible display, and the like.

Figure 3:
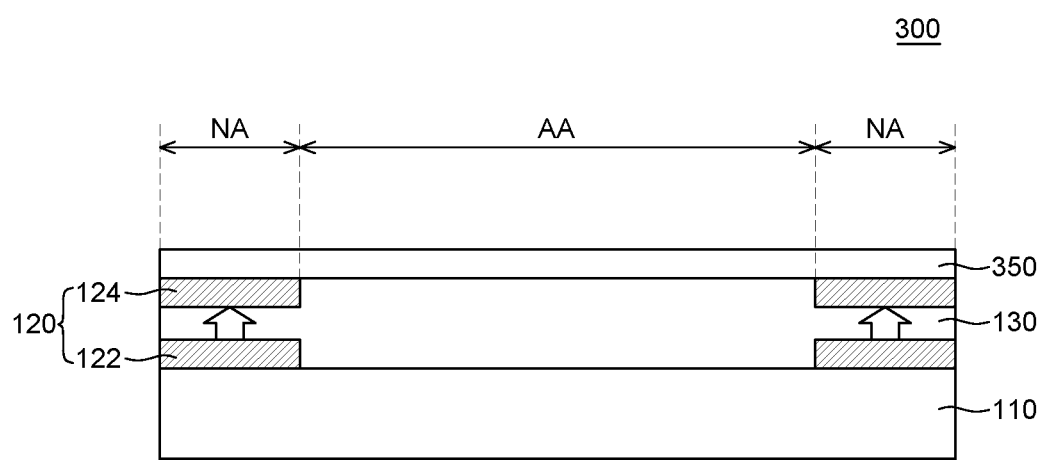
FIG. 3 is a cross-sectional view schematically illustrating a display apparatus according to another embodiment of the present disclosure.

FIG. 3 is a cross-sectional view schematically illustrating a display apparatus according to another embodiment of the present disclosure.

Since the display apparatus 300 according to another embodiment of the present disclosure may include elements substantially similar to the display apparatus 100 according to an embodiment of the present disclosure, redundant explanations may be omitted for the sake of convenience. The elements of the embodiment shown in and explained for FIG. 2 can also be applied to the embodiment of FIG. 3.

The display apparatus 300 according to another embodiment of the present disclosure may include a display panel 110, a light shielding structure 120, an adhesive member 130, and a cover member 350.

The cover member 350 may be made of a hard coating layer. The hard coating layer may be any coating composition that can improve the surface hardness of the cover member 350. In addition, the thickness of the cover member 350 may be 5 µm to 20 µm, but the present disclosure is not limited thereto. When the cover member 350 is made of a coating material, the cover member 350 may be coated on the light shielding structure 120. When the cover member 350 is a coating material, it is conformally formed along the step of the coated surface. In this case, since the step difference is compensated by the light shielding structure 120, there is an effect that the step of the cover member 350 can be minimized. Also, there is an effect that it is possible to improve the problem that the step difference might be visually recognized by the user and the appearance quality of the display device 300 might be deteriorated.

The cover member 350 may be made of a material having excellent impact resistance and light transmittance as well as having excellent folding properties. For example, the cover member 350 may be a plastic film. In addition, the cover member 350 may be made of various plastic materials as described above, but the present disclosure is not limited thereto. The cover member 350 of this embodiment can be realized with a thin thickness. For example, the cover member 350 may have a thickness of 80 µm or less. However, the present disclosure is not limited thereto.

The cover member 350 may be formed of at least one material among acrylic, polyurethane, polyacrylate, polyacetate, polyester, polyether, olefins, polyimide, silicon, and epoxy in consideration of its thin thickness and the flexible property. However, the present disclosure is not limited thereto.

The layer capable of improving the surface hardness of the cover member 350 may include a base oligomer or base monomer and an initiator. Here, the base oligomer or the base monomer is polymerized through a curing process, and may be made of acrylic or epoxy-based materials, but the present disclosure is not limited thereto. The initiator may also be a photo-initiator, specifically, an ultraviolet photo-initiator. But the present disclosure is not limited thereto. In this case, the initiator may be a cationic initiator including a metallic ingredient that can remain in the original state after the curing process, for example, a borate series such as SbF6−, SiF6−, or Ph3S+ may be used as the cation initiator. Such a cationic initiator can be detected by the metal ion component analysis after the curing process. In addition, the initiator may be composed of a substance that participates in the curing reaction after the curing process and bonds to the base oligomer or the base monomer, and may be, for example, an amine-based initiator or an imidazole-based initiator. Initiators participating in this curing reaction can be detected after the curing process by using DSC analysis, FT-IR analysis, NMR analysis, and the like. Here, the composition ratio of the initiator may be 1 to 5 WT % based on the base oligomer or the base monomer, but the present disclosure is not limited thereto.

In addition, the cover member 350 according to another embodiment of the present disclosure has an effect that can be applied to a flexible display apparatus and the like, but the present disclosure is not limited thereto and can be applied to a flat panel display device.

Figure 4:
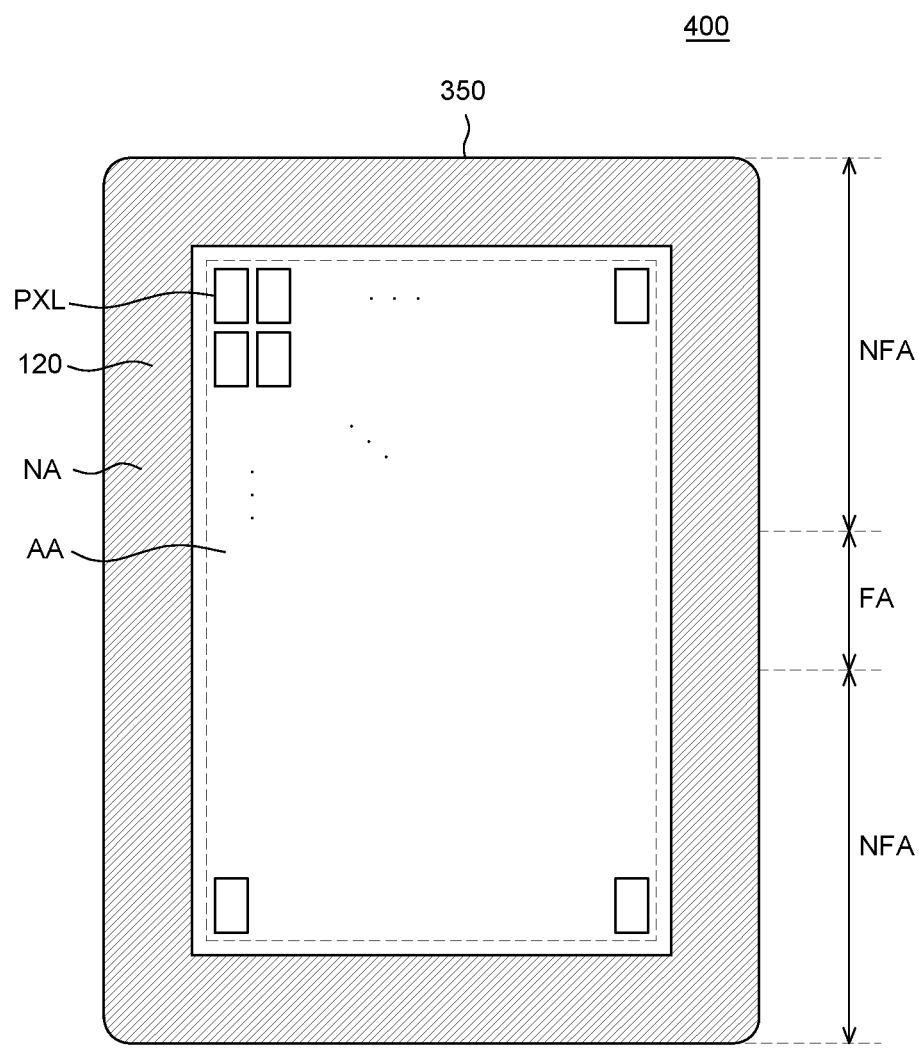
FIG. 4 is a plan view schematically illustrating a foldable display apparatus according to another embodiment of the present disclosure.

FIG. 4 is a plan view schematically illustrating a foldable display apparatus according to the other embodiment of the present disclosure.

Since the display apparatus 400 according to the other embodiment of the present disclosure substantially includes elements similar to the display apparatus 300 according to another embodiment of the present disclosure, for the sake of convenience of description, redundant descriptions may be omitted.

Since the sectional view of the display apparatus 400 is substantially similar to the display apparatus 300 as shown in FIG. 3, redundant descriptions may be omitted.

The display apparatus 400 according to the other embodiment of the present disclosure may include a display panel 110, a light shielding structure 120, an adhesive member 130, and a cover member 350.

If the thickness of the cover member 350 and the adhesive member 130 of the display apparatus 300 described in another embodiments of the present disclosure is reduced, the display apparatus 300 according to another embodiment of the present disclosure can be designed as the display apparatus 400 according to the other embodiment which has a folding characteristic.

The display apparatus 400 may be configured to include a folding area FA and a non-folding area NFA adjacent to the folding area FA. The display apparatus 400 can be folded in the folding area.

The display apparatus 400 according to the other embodiment of the present disclosure has an effect of reducing the thickness of the display apparatus 400 and improving the folding characteristic since the cover member 350 is thin and has excellent folding characteristics. Further, the display apparatus 400 may be configured such that the specific portion, for example, folding area FA is folded. Such a display apparatus can be referred to as a foldable display apparatus. For example, the thickness of the adhesive member 130 may be 50 µm or less. For example, preferably, the thickness of the adhesive member 130 may be 30 µm or less. Further, the cover member 350 can be realized with a thin thickness. For example, the cover member 350 may have a thickness of 80 µm or less. However, the present disclosure is not limited thereto.

In addition, in the case of the foldable display apparatus of the present disclosure, since the display device is intentionally deformed by applying a physical force, a new problem that was not considered in the case of the flat panel display device may occur.

Specifically, the thicknesses of the adhesive member 130 and the cover member 350 are related to folding characteristics.

As a result of the experiment of the present disclosure, cracks were observed in the cover member 350 and/or the display panel 110 when the thickness of the cover member 350 was large, for example, around 200 µm. This is because when the thickness of the cover member 350 is large, the neutral plane of the display panel 110 adhered to the cover member 350 is shifted due to changing the tensile stress or the compressive stress applied to the display panel 110.

As a result of the experiment of the present disclosure, it was observed that when the thickness of the adhesive member 130 is increased, the adhesive member 130 can be peeled off from the cover member 350 or the display panel 110 due to stress generated during folding. For example, when the thickness of the adhesive member 130 is as large as about 100 µm, it has been confirmed that the adhesive member 130 can be peeled off due to tensile stress or compressive stress at the time of folding. The peeled gap described above may be a permeation path of oxygen and/or moisture and may cause a defect of the display apparatus 400.

The thickness of the cover member 350 and the adhesive member 130 of the display apparatus 400 according to the other embodiment of the present disclosure can be reduced in consideration of the folding property and as described above, there is an effect that even when the thicknesses of the cover member 350 and the adhesive member 130 are reduced, the step difference problem can be solved by the light shielding structure 120.

Figure 5:
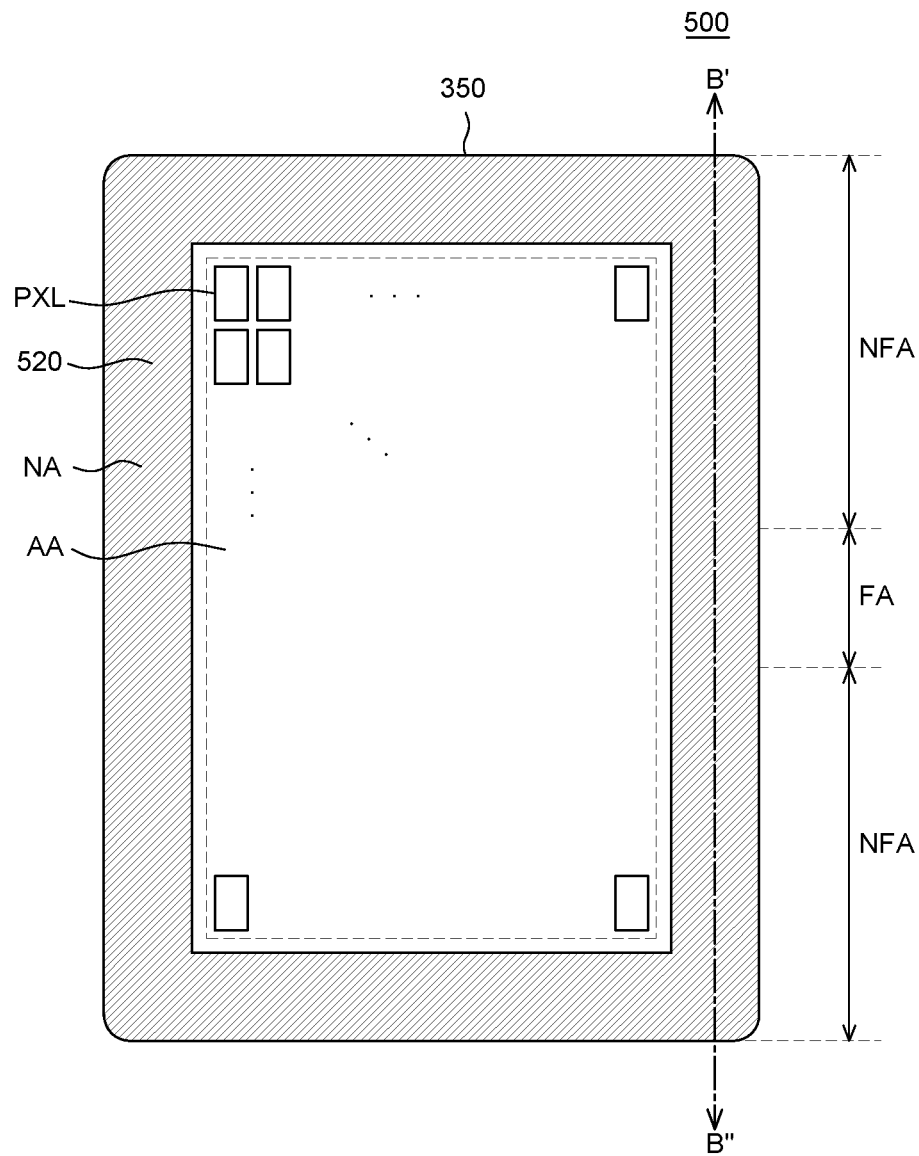
FIG. 5 is a plan view schematically illustrating a display apparatus according to another embodiment of the present disclosure.
Figure 6:
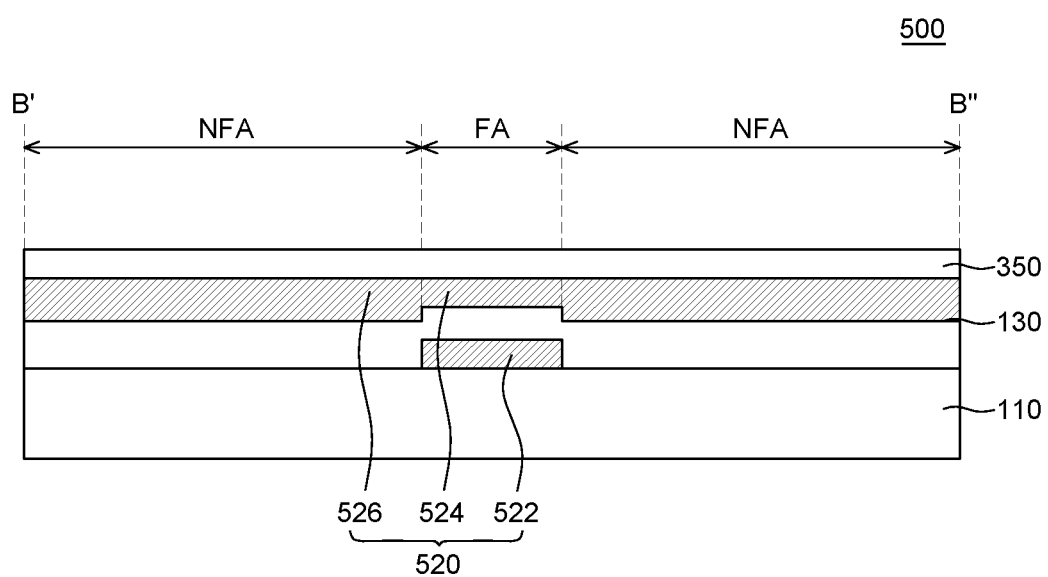
FIG. 6 is a cross-sectional view schematically illustrating the cross-section B'-B" of the display apparatus of FIG. 5 according to an embodiment of the present disclosure.

FIG. 5 is a plan view schematically illustrating a display apparatus according to the other embodiment of the present disclosure. FIG. 6 is a cross-sectional view schematically illustrating the cross-section B'-B" of the display apparatus of FIG. 5 according to an embodiment of the present disclosure.

Since the display apparatus 500 according to the other embodiment of the present disclosure may include elements substantially similar to the display apparatus 400 according to the other embodiment of the present disclosure, for the sake of convenience of description, redundant descriptions may be omitted.

A display apparatus 500 according to the other embodiment of the present disclosure may include a display panel 110, a light shielding structure 520, an adhesive member 130, and a cover member 350.

The display apparatus 500 includes a plurality of non-folding areas NFA, a folding area FA between a plurality of non-folding areas NFA and a plurality of light shielding members 522, 524 overlapping each other positioned at least in the folding area FA.

The light shielding structure 520 may include a first light shielding member 522, a second light shielding member 524, and a third light shielding member 526. However, the structure of the light shielding structure 520 is not limited hereto, and the light shielding structure 520 may include a plurality of light shielding members on the flexible display panel. Two or more light shielding members in the plurality of light shielding members may overlap with each other in the first direction. The thicknesses of the second light shielding member 524 and the third light shielding member 526 may be different from each other. The second light shielding member 524 and the third light shielding member 526 may be connected to each other. The first light shielding member 522 and the second light shielding member 524 may be disposed in the folding area FA. Further, the third light shielding member 526 may be disposed in the non-folding area NFA. That is, the light shielding structure 520 may be configured to have a structure corresponding to the folding area FA and the non-folding area NFA. A set of light shielding members in the plurality of light shielding members may be positioned at least on the folding area FA of the flexible display panel. The plurality of light shielding members may also include at least one light shielding member positioned on an area of the display panel outside the folding area FA.

The light shielding member 526 connected to one light shielding member 524 of the plurality of light shielding members 522, 524 may be configured to cover the periphery area NA of the plurality of non-folding areas NFA. In other words, the second light shielding member 524 and the third light shielding member 526 may be referred to as a light shielding member having a different thickness depending on the folding.

At least one light shielding member 526 covering the peripheral area NA may be connected to one of the plurality of light shielding members 522, 524 disposed in the folding area FA. The thickness of the connected light shielding member among the light shielding members 524, 526 may be configured so that the thickness of the light shielding member in the folding area FA is relatively thinner than the thickness of the light shielding member in the non-folding area NFA. For example, the light shielding member 524 disposed in the folding area FA may be a thickness resulting a semitransparent characteristic, and the light shielding member 526 disposed in the non-folding area NFA may be a thickness resulting an opaque characteristic. According to the above-described configuration, the thickness of each of the light shielding members 522, 524 disposed in the folding area FA can be reduced. Therefore, there is an effect that the folding characteristics of the light shielding members 522, 524 disposed in the folding area FA can be improved.

Figure 7:
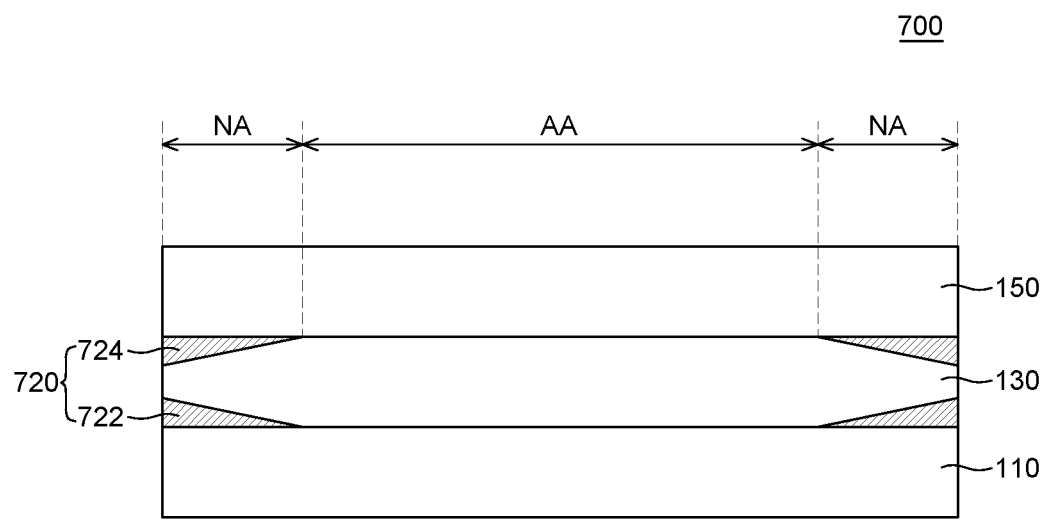
FIG. 7 is a cross-sectional view schematically illustrating a display apparatus according to another embodiment of the present disclosure.

FIG. 7 is a cross-sectional view schematically illustrating a display apparatus according to the other embodiment of the present disclosure.

Since the display apparatus 700 according to the other embodiment of the present disclosure may include elements substantially similar to the display apparatus 100 according to an embodiment of the present disclosure, for the sake of convenience of description, redundant descriptions may be omitted.

The display apparatus 700 according to the other embodiment of the present disclosure may include a display panel 110, a light shielding structure 720, an adhesive member 130, and a cover member 150.

The light shielding structure 720 may be configured to include a first light shielding member 722 and a second light shielding member 724. The first light shielding member 722 and the second light shielding member 724 may be configured to have a reduced thickness as they toward to the display area AA. According to the above-described configuration, there is an effect that the abrupt change in thickness can be alleviated and the step of the adhesive member 130 can be effectively compensated. In other words, a first portion of at least one light shielding member in the plurality of light shielding members may have a first thickness, and a second portion of the at least one shielding member positioned farther away from an edge portion of the flexible display panel than the first portion may have a second thickness smaller than the first thickness.

Figure 8:
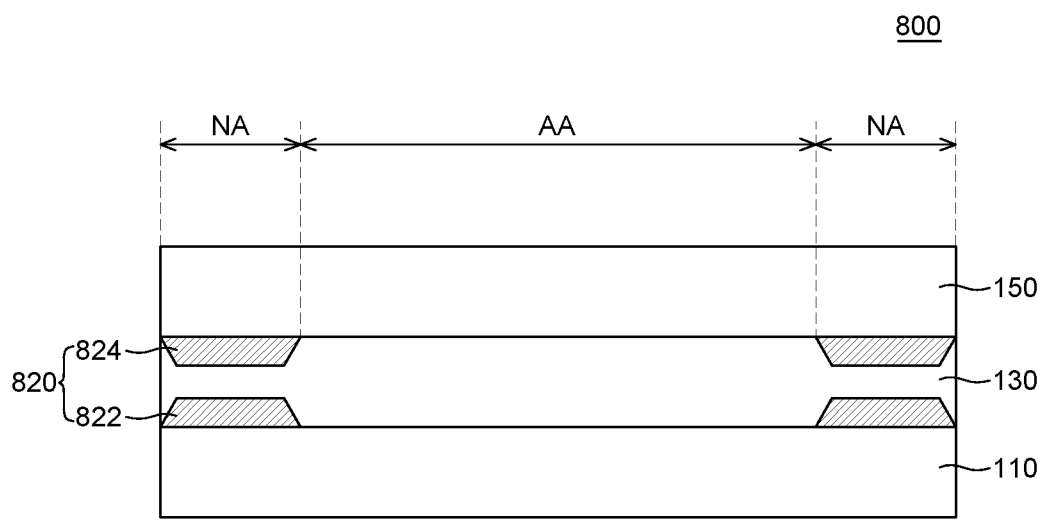
FIG. 8 is a cross-sectional view schematically illustrating a display apparatus according to another embodiment of the present disclosure.

FIG. 8 is a cross-sectional view schematically illustrating a display apparatus according to the other embodiment of the present disclosure.

Since the display apparatus 800 according to the other embodiment of the present disclosure may include elements substantially similar to the display apparatus 100 according to an embodiment of the present disclosure, for the sake of convenience of description, redundant descriptions may be omitted.

The display device 800 according to the other embodiment of the present disclosure may include a display panel 110, a light shielding structure 820, an adhesive member 130, and a cover member 150.

The light shielding structure 820 is configured to include a first light shielding member 822 and a second light shielding member 824. The first light shielding member 822 and the second light shielding member 824 may be configured to have a predetermined taper at the edge portion. According to the above-described structure, there is an effect that it is possible to alleviate a sudden change in thickness at the edge portion, so that the step of the adhesive member 130 can be effectively compensated. Due to the tapered shape, a first portion of at least one light shielding member may have a first width, and a second portion of the at least one light shielding member positioned farther away from the cover member 150 in the first direction may have a second width smaller than the first width.

Figure 9:
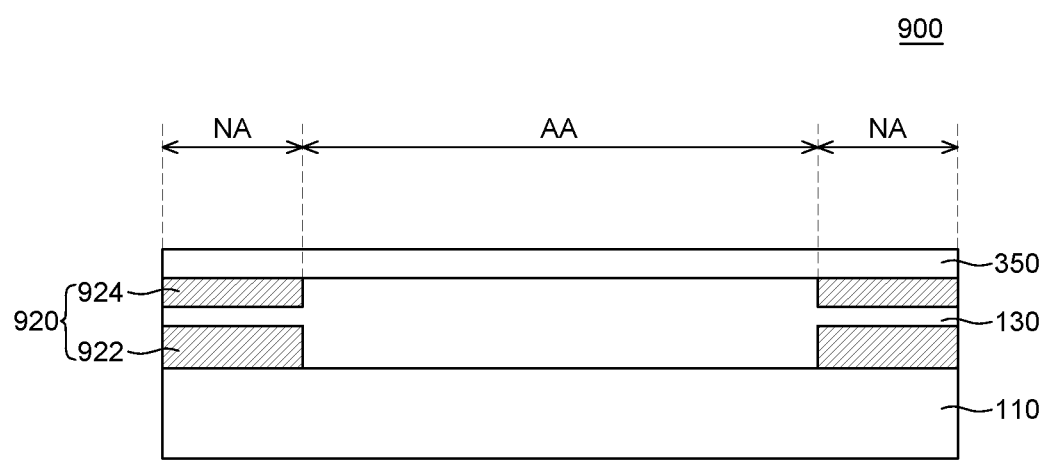
FIG. 9 is a cross-sectional view schematically illustrating a display apparatus according to another embodiment of the present disclosure.

FIG. 9 is a cross-sectional view schematically illustrating a display apparatus according to the other embodiment of the present disclosure.

Since the display apparatus 900 according to the other embodiment of the present disclosure may include elements substantially similar to the display apparatus 100 according to an embodiment of the present disclosure, for the sake of convenience of description, redundant descriptions may be omitted.

The display apparatus 900 according to the other embodiment of the present disclosure may include a display panel 110, a light shielding structure 920, an adhesive member 130, and a cover member 350.

The light shielding structure 920 is configured to include a first light shielding member 922 and a second light shielding member 924. The first light shielding member 922 and the second light shielding member 924 may be configured to have different thicknesses from each other. According to above-described configuration, the second light shielding member 924 adjacent the cover member 350 can be formed to be relatively thin when the cover member 350 is formed of the hard coating layer. For example, the second light shielding member 924 may have a thickness of 1 μm to 2 μm. However, the present disclosure is not limited thereto. The first light shielding member 922 is formed to be relatively thick. For example, it may have a thickness of 4 μm to 6 μm. However, the present disclosure is not limited thereto. According to the above-described configuration, there is an effect that even if the thickness of the cover member 350 is small, the step due to the thickness of the second light shielding member 924 can be minimized, so that the reliability of the cover member 350 can be improved.

Figure 10:
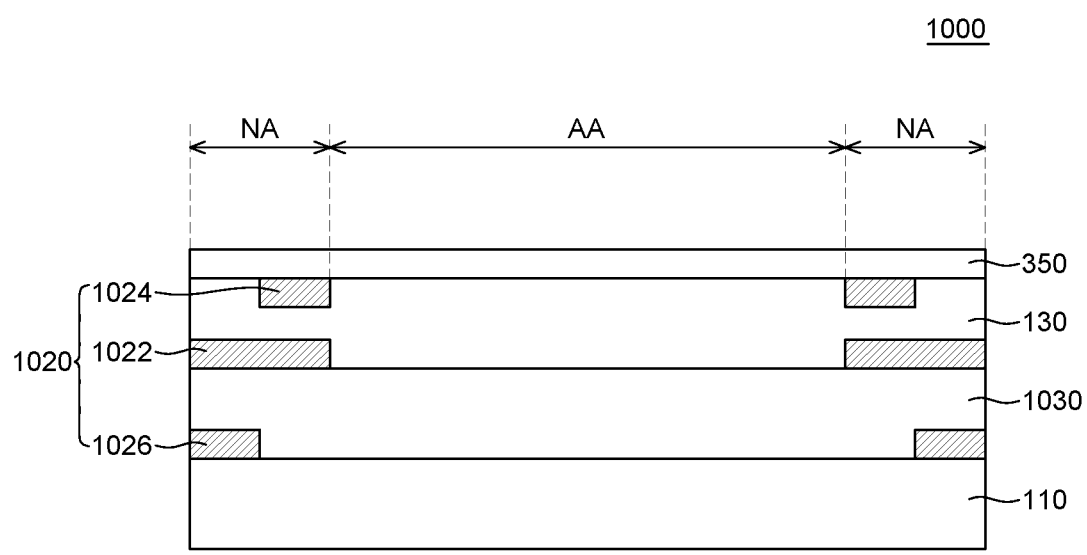
FIG. 10 is a cross-sectional view schematically illustrating a display apparatus according to another embodiment of the present disclosure.

FIG. 10 is a cross-sectional view schematically illustrating a display apparatus according to the other embodiment of the present disclosure.

Since the display apparatus 1000 according to the other embodiment of the present disclosure may include elements substantially similar to the display apparatus 100 according to an embodiment of the present disclosure, for the sake of convenience of description, redundant descriptions may be omitted.

A display apparatus 1000 according to the other embodiment of the present disclosure may include a display panel 110, a light shielding structure 1020, an adhesive member 130, a cover member 350, and a polarizer 1030.

The light shielding structure 1020 may be configured to include a plurality of light shielding members 1022, 1024, 1026. A part of the plurality of light shielding members 1022, 1024, 1026 may be disposed on the bottom surface of the polarizer 1030 and another part may be disposed on the upper surface of the polarizer 1030. Two or more of the light shielding members may overlap with each other in a first direction. However, the structure of the light shielding structure 1020 is not limited hereto, and the light shielding structure 1020 may include four or more light shielding members as well.

Each of the light shielding members 1022, 1024, 1026 may have different cross-sectional widths, and may be configured to partially overlap each other. According to the above-described configuration, even if the light shielding member has a translucent property, there is an effect that the light leakage problem can be suppressed by overlapping the other light shielding member so as to block the leakage light. Thus, at least one of the plurality of light shielding members is translucent, and an overlapped portion of the two or more light shielding members may be opaque. Also, as shown in FIG. 10, the first light shielding member 1022 may have a first width. The second light shielding member 1024 on the first light shielding member 1022 may have a second width different from the first width, and may overlap with the first light shielding member 1022 in the first direction. The third light shielding member 1026 under the first light shielding member 1022 may have a third width different from the second width, and may overlap with the first light shielding member 1022 in the first direction but may not overlap with the second light shielding member 1024 in the first direction.

Figure 11:
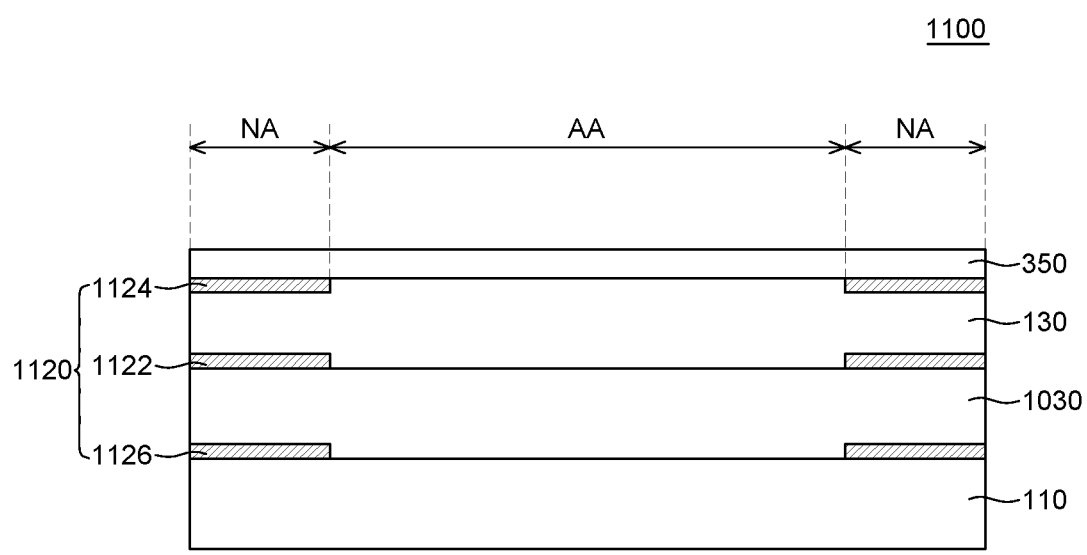
FIG. 11 is a cross-sectional view schematically illustrating a display apparatus according to another embodiment of the present disclosure.

FIG. 11 is a cross-sectional view schematically illustrating a display apparatus according to the other embodiment of the present disclosure.

Since the display apparatus 1100 according to the other embodiment of the present disclosure may include elements substantially similar to the display apparatus 100 according to an embodiment of the present disclosure, for the sake of convenience of description, redundant descriptions may be omitted.

The display apparatus 1100 according to the other embodiment of the present disclosure may include a display panel 110, a light shielding structure 1120, an adhesive member 130, a cover member 350, and a polarizer 1030.

The light shielding structure 1120 is configured to include a plurality of light shielding members 1122, 1124, 1126. For example, the three light shielding members 1122, 1124, 1126 are configured to have a thickness less than a predetermined thickness to have a translucency property and the light shielding members 1122, 1124, 1126 are configured to be overlapped each other so as to have an opaque property.

According to the above-described constitution, since the thickness of each light shielding member can be minimized, it is possible to further reduce the step difference in thickness of the plurality of light shielding members 1122, 1124, 1126.

Also, the light shielding structures 120, 720, 820, 920, 1020, 1120 according to various embodiments of the present disclosure described herein have various effects of improving the folding characteristics while maintaining the light shielding characteristic when applied to the foldable display device, but the present disclosure is not limited thereto, and the light shielding structures 120, 720, 820, 920, 1020 and 1120 according to various embodiments can be applied to a flat panel display. According to some embodiments, the light shielding structure may include a plurality of light shielding members, and each of the light shielding members may have opaque or translucent characteristics.

According to some embodiments, the light shielding structure may include a plurality of light shielding members, and the thickness of each light shielding member may be set individually.

According to some embodiments, the light shielding structure may include a plurality of light shielding members, and an edge portion of each light shielding member may have a predetermined taper.

According to some embodiments, a polarizer may be additionally disposed on the back surface of the adhesive member. The polarizer can perform a function for minimizing the reflection of external light incident on the foldable display panel. However, depending on the design of the display panel, the polarizer may be optionally included and may be omitted.

According to some embodiments, the display panel may include various additional elements for generating various signals or for driving pixels in the display area. The additional elements may include an inverter circuit, a multiplexer, an electrostatic discharge circuit, and the like. The display panel may also include additional elements associated with functions other than pixel driving. For example, the display apparatus may include additional elements that provide a touch function, a user authentication function, for example, fingerprint recognition, a multi-level pressure sensing function, a tactile feedback function, and the like. However, the present disclosure is not limited thereto.

According to some embodiments, when the display panel is an organic light emitting display panel, the display panel may include an encapsulation layer for protecting the organic light emitting element. The encapsulation layer can protect the organic light emitting element of the display panel from external moisture, oxygen, impact, and the like. The encapsulation layer may have a structure in which an inorganic layer composed of an inorganic material such as silicon oxide (SiOx), silicon nitride (SiNx) and the like and an organic layer composed of an organic material such as an acrylic organic material or an epoxy organic material can be alternately laminated. However, the present disclosure is not limited thereto.

According to some embodiments, some features of each of the embodiments described in FIGS. 1 to 11 may be selectively combined with each other.

The exemplary embodiments of the present disclosure can also be described as follows:

According to an aspect of the present disclosure, a display apparatus may include a flexible display panel including a display area configured to display an image and a periphery area adjacent to the display area, a first light shielding member, configured to shield a light at least a portion of the periphery area at a first light shielding rate, disposed on the flexible display panel, an adhesive member configured to cover the first light shielding member and the flexible display panel, a second light shielding member, overlapped at least a portion of the first light shielding member, configured to shield the light at a second light shielding rate, disposed on the adhesive member, and a cover member configured to cover the adhesive member and the second light shielding member.

A thickness of the first light shielding member and a thickness of the second light shielding member may be the same, and a light shielding rate of the area, where the first light shielding member and the second light shielding member are overlapped, may be 90% or more.

A thickness of the first light shielding member and a thickness of the second light shielding member may be different from each other, and a light shielding rate of the area where the first light shielding member and the second light shielding member are overlapped is 90% or more.

An optical density level of each of the first light shielding member and the second light shielding member may be less than 5, and an overall optical density level according to an overlap of the first light shielding member and the second light shielding member may be 5 or more.

A sum of thicknesses of the first light shielding member and the second light shielding member may be less than 14 μm.

A thickness of each of the first light shielding member and the second light shielding member may be 1 μm to 7 μm.

The adhesive member may be configured to compensate a step between the first light shielding member and the second light shielding member, and the step of the cover member may be reduced by the adhesive member.

According to another aspect of the present disclosure, a foldable display apparatus may include a flexible display panel, a plurality of light shielding members, configured to shield a light at least a portion of a periphery area surrounding a display area of the flexible display panel, overlapped each other, an adhesive member disposed between the plurality of light shielding members, and a cover member disposed on the plurality of light shielding members and the adhesive member.

The adhesive member may be disposed between the plurality of shielding members so as to compensate a step of the plurality of shielding members.

The flexible display panel may include a plurality of non-folding areas and a folding area between the plurality of non-folding areas, and the plurality of light shielding members may be positioned at least in the folding area.

At least one of the plurality of light shielding members may be configured to cover the periphery area of the plurality of non-folding area.

The at least one light shielding member covering the periphery area may be connected to one of the plurality of light shielding members in the folding area, and a thickness of the connected shielding member may be relatively thinner in the folding area than in the non-folding area.

At least one of the plurality of light shielding members may be configured to have a taper whose thickness is gradually increased.

The plurality of light shielding members may overlap each other and may include a predetermined area whose thickness is gradually increased in the same direction.

According to yet another aspect of the present disclosure, a display apparatus may include a flexible display panel, and a plurality of light shielding members, configured to shield a light at least a portion of a periphery area surrounding a display area of the flexible display panel, in which at least a portion thereof are overlapped with each other, wherein at least one of the plurality of light shielding members is configured to have a translucent characteristic determined by a first thickness range, and wherein the plurality of light shielding members is configured to have an opaque characteristic such that a sum of thicknesses of at least two light shielding members vertically overlapped each other is equal to or greater than a second thickness.

The second thickness may be thicker than the first thickness range.

The plurality of light shielding members may include at least three light shielding members.

A first light shielding member among the plurality of light shielding members may be configured to have a first width in the periphery area, a second light shielding member among the plurality of light shielding members may be configured to have a second width different from the first width in the periphery area and may be configured to overlap with the first light shielding member, and a third light shielding member among the plurality of light shielding members, may be configured to have a third width different from the second width in the periphery area, may not be overlapped with the first light shielding member, and may be overlapped with the second light shielding member.

The flexible display panel may include a non-folding area and a folding area, and the plurality of light shielding members in the non-folding area may be smaller in number than the plurality of light shielding members in the folding area.

The display apparatus may further comprise an adhesive member disposed between the plurality of light shielding members and a cover member covering the adhesive member and the plurality of light shielding members. The cover member may comprise at least one material among acrylic, polyurethane, polyacrylate, polyacetate, polyester, polyether, olefin, polyimide, silicone, and epoxy. The cover member may be coated of a thickness of 5 μm to 20 μm.

The foregoing description is merely illustrative of the present disclosure, and various modifications may be made by those skilled in the art without departing from the technical concept of the present disclosure. Therefore, the embodiments disclosed in the specification of the present disclosure are not intended to limit the present disclosure. Thus, the scope of the present disclosure should be construed according to the following claims, and all the technical ideas within the scope of equivalents should be construed as being included in the scope of the present disclosure.

What is claimed is:

1. A display apparatus including:
   a flexible display panel including a display area configured to display an image and a periphery area adjacent to the display area;
   a first light shielding member disposed on at least the periphery area of the flexible display panel;
   an adhesive member covering the first light shielding member and the flexible display panel;
   a second light shielding member disposed on the adhesive member and the first light shielding member in a first direction, wherein at least a portion of the second light shielding member overlaps at least a portion of the first light shielding member in the first direction; and
   a cover member covering the adhesive member and the second light shielding member,
   wherein the adhesive member is in contact with the first light shielding member and the second light shielding member,
   wherein an optical density level of each of the first light shielding member and the second light shielding member is less than 5, and
   wherein an overall optical density level of the portion of the first light shielding member, the portion of the second light shielding member, and a portion of the adhesive member between the first light shielding member and the second light shielding member is 5 or more.

2. The display apparatus of claim 1,
   wherein a thickness of the first light shielding member and a thickness of the second light shielding member are the same, and
   wherein a light shielding rate of the portion of the first light shielding member, the portion of the second light shielding member, and a portion of the adhesive member between the first light shielding member and the second light shielding member in the first direction is 90% or more.

3. The display apparatus of claim 1,
   wherein a thickness of the first light shielding member and a thickness of the second light shielding member are different, and
   wherein a light shielding rate of the portion of the first light shielding member, the portion of the second light shielding member, and a portion of the adhesive member between the first light shielding member and the second light shielding member in the first direction is 90% or more.

4. The display apparatus of claim 1, wherein a sum of a thickness of the first light shielding member and a thickness of the second light shielding member is less than 14 μm.

5. The display apparatus of claim 1, wherein a thickness of each of the first light shielding member and the second light shielding member is 1 μm to 7 μm.

6. The display apparatus of claim 1, wherein a thickness of the adhesive member is 50 μm or less.

7. A foldable display apparatus including:
   a flexible display panel;
   a plurality of light shielding members on the flexible display panel, wherein at least two of the plurality of light shielding members overlap with each other in a first direction;
   an adhesive member disposed between the plurality of light shielding members; and
   a cover member disposed on the plurality of light shielding members and the adhesive member,
   wherein the adhesive member is in contact with the at least two of the plurality of light shielding members overlapping each other,
   wherein the flexible display panel includes a folding area, and
   wherein a number of light shielding members outside the folding area is smaller than a number of light shielding members in the folding area.

8. The foldable display apparatus of claim 7, wherein a thickness of the adhesive member is 50 μm or less.

9. The foldable display apparatus of claim 7, wherein a set of light shielding members in the plurality of light shielding members are positioned at least on the folding area of the flexible display panel.

10. The foldable display apparatus of claim 9, wherein at least one of the plurality of light shielding members is positioned on an area of the flexible display panel outside the folding area.

11. The foldable display apparatus of claim 10,
    wherein the at least one light shielding member is connected to a light shielding member in the set of light shielding members on the folding area, and
    wherein a thickness of the light shielding member in the folding area is thinner than a thickness of the at least one light shielding member.

12. The foldable display apparatus of claim 7, wherein at least one of the plurality of light shielding members has a tapered shape, in which a first portion of the at least one light shielding member has a first width and a second portion of the at least one light shielding member positioned farther away from the cover member than the first portion has a second width smaller than the first width.

13. The foldable display apparatus of claim 7, wherein a first portion of at least one of the plurality of light shielding members has a first thickness, and a second portion of the at least one light shielding member positioned farther away from an edge of the flexible display panel than the first portion has a second thickness smaller than the first thickness.

14. A display apparatus including:
    a flexible display panel;
    a plurality of light shielding members arranged along a first direction on the flexible display panel, wherein at least two or more of the plurality of light shielding members overlap with each other in the first direction; and
    an adhesive member disposed between the plurality of light shielding members, wherein the adhesive member is in contact with the at least two or more of the plurality of light shielding members overlapping each other, wherein at least one of the plurality of light shielding members is translucent, and wherein an overlapped portion of the two or more light shielding members is opaque, wherein a light shielding rate of the overlapped portion of the two or more light shielding members and a portion of the adhesive member between the plurality of light shielding members in the first direction is 90% or more.

15. The display apparatus of claim 14, wherein a thickness of a first light shielding member is smaller than a thickness of a second light shielding member positioned farther away from the cover member than the first light shielding member.

16. The display apparatus of claim 14, wherein the plurality of light shielding members include at least three light shielding members.

17. The display apparatus of claim 16, wherein the plurality of light shielding members include:
    a first light shielding member having a first width;
    a second light shielding member on the first light shielding member, wherein the second light shielding member has a second width different from the first width, and overlaps with the first light shielding member in the first direction; and
    a third light shielding member under the first light shielding member, wherein the third light shielding member has a third width different from the second width, overlaps with the first light shielding member in the first direction, and does not overlap with the second light shielding member in the first direction.

18. The display apparatus of claim 14,
    wherein the flexible display panel includes a folding area, and
    wherein a number of light shielding members outside the folding area is smaller than a number of light shielding members in the folding area.

19. The display apparatus of claim 14, further comprising:
    a cover member covering the adhesive member and the plurality of light shielding members,
    wherein the cover member comprises at least one material among acrylic, polyurethane, polyacrylate, polyacetate, polyester, polyether, poly-olefin, polyimide, silicone, and epoxy, and
    wherein a thickness of the cover member is 5 µm to 20 µm.

* * * * *